United States Patent
Lim et al.

(10) Patent No.: US 7,919,777 B2
(45) Date of Patent: Apr. 5, 2011

(54) BOTTOM GATE THIN FILM TRANSISTOR AND METHOD OF MANUFACTURING THE SAME

(75) Inventors: Hyuck Lim, Yongin-si (KR); Young-soo Park, Yongin-si (KR); Wenxu Xianyu, Yongin-si (KR); Young-kwan Cha, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/566,106

(22) Filed: Sep. 24, 2009

(65) Prior Publication Data

US 2010/0059750 A1    Mar. 11, 2010

Related U.S. Application Data

(62) Division of application No. 11/692,716, filed on Mar. 28, 2007, now Pat. No. 7,629,207.

(30) Foreign Application Priority Data

Jun. 9, 2006  (KR) .................. 10-2006-0052101

(51) Int. Cl.
*H01L 21/00* (2006.01)
*H01L 21/84* (2006.01)
*H01L 29/04* (2006.01)

(52) U.S. Cl. ............... 257/61; 257/59; 257/64; 257/66; 257/69; 257/72; 257/E21.133; 257/E21.134; 257/E29.121; 438/149; 438/151; 438/166

(58) Field of Classification Search ............ 257/59, 257/61, 64, 66, 69, 72, E21.133, E21.134, 257/E29.121; 438/149, 151, 166
See application file for complete search history.

(56) References Cited

U.S. PATENT DOCUMENTS

| 7,173,278 | B2 | 2/2007 | Tsujimura et al. | |
|---|---|---|---|---|
| 7,471,368 | B2 | 12/2008 | Yamazaki et al. | |
| 2005/0017243 | A1* | 1/2005 | Zhang et al. | 257/59 |
| 2005/0074930 | A1* | 4/2005 | Chen et al. | 438/151 |
| 2007/0087490 | A1* | 4/2007 | Seo et al. | 438/158 |

OTHER PUBLICATIONS

"A Poly-Si TFT Fabricated by Excimer Laser Recrystallization on Floating Active Structure"; Authors: Cheon-Hong Kim, et al.; IEE Electron Device Letters, vol. 23, No. 6, Jun. 2002, pp. 315-317.

* cited by examiner

*Primary Examiner* — Dao H Nguyen
(74) *Attorney, Agent, or Firm* — Cantor Colburn LLP

(57) ABSTRACT

A method of manufacturing a bottom gate thin film transistor ("TFT") in which a polycrystalline channel region having a large grain size is formed relatively simply and easily. The method of manufacturing a bottom gate thin film transistor includes forming a bottom gate electrode on a substrate, forming a gate insulating layer on the substrate to cover the bottom gate electrode, forming an amorphous semiconductor layer, an N-type semiconductor layer and an electrode layer on the gate insulating layer sequentially, etching an electrode region and an N-type semiconductor layer region formed on the bottom gate electrode sequentially to expose an amorphous semiconductor layer region, melting the amorphous semiconductor layer region using a laser annealing method, and crystallizing the melted amorphous semiconductor layer region to form a laterally grown polycrystalline channel region.

11 Claims, 4 Drawing Sheets

BOTTOM GATE THIN FILM TRANSISTOR AND METHOD OF MANUFACTURING THE SAME

CROSS-REFERENCE TO RELATED APPLICATIONS

This application is a divisional application of U.S. application Ser. No. 11/692,716, filed on Mar. 28, 2007, which claims priority to Korean Patent Application No. 10-2006-0052101, filed on Jun. 9, 2006, and all the benefits accruing therefrom under 35 U.S.C. §119, the contents of which in its entirety are herein incorporated by reference.

BACKGROUND OF THE INVENTION

1. Field of the Invention

The present invention relates to a method of manufacturing a thin film transistor ("TFT"), and more particularly, to a method of manufacturing a bottom gate TFT in which a polycrystalline channel region having a large grain size can be formed relatively simply and easily.

2. Description of the Related Art

Active research on a low temperature poly-Si ("LTPS") TFT, which is used in light sources of organic light emitting display ("OLED") devices or liquid crystal display ("LCD") devices, has been conducted recently. Accordingly, research on a system on glass ("SOG"), in which an outer driver integrated circuit ("IC") is never employed, has been further conducted. The outer driver IC is integrally formed on a display panel, and thus a connection line between the display panel and the outer driver IC is not required. Accordingly, display devices have a reduced error rate and improved reliability. Therefore an objective of this research includes development of a LTPS TFT for a SOG in which all display systems, including data and gate driver ICs, and a controller, are integrally formed on the display panel. To achieve this objective, the LTPS should have mobility greater than 400 cm$^2$/Vsec and excellent uniformity. To date, a LTPS having these properties can not be manufactured using excimer laser annealing ("ELA"), sequential lateral solidification ("SLS"), metal-induced lateral crystallization ("MILC"), or the like, which are known to those of ordinary skill in the art.

Polycrystalline silicon is manufactured using various methods. For example, a method of directly depositing polycrystalline silicon and a method of crystallizing amorphous silicon after depositing the amorphous silicon can be used. Polycrystalline silicon manufactured by crystallizing has a large grain size. Thus the field effect mobility of the polycrystalline silicon is further increased, but the grain size uniformity of the polycrystalline silicon is further reduced. Conventional ELA can only enlarge the grain size of the polycrystalline silicon by a limited amount. To overcome this limit, Kim et al. (Kim et al., IEEE ELECTRON DEVICE LETTERS, VOL. 23, NO. 6, June 2002, pgs. 315-317) suggests a method of manufacturing polycrystalline silicon having a grain size of several μm. A lateral grain having a length of 4.6 μm can be manufactured using a novel method of crystallizing. In this method, it is required that an oxide capping layer and an air gap be formed on upper and lower parts of amorphous silicon for controlling crystallization velocity. Accordingly, this method includes an additional operation. In particular, the air gap is formed by forming and removing an additional scarification layer, and the oxide capping layer is removed in a final step. The additional operation is not desirable in view of mass production, and in particular, may affect product yield, thus resulting in increased manufacturing costs.

BRIEF SUMMARY OF THE INVENTION

An aspect of the present invention provides a method of manufacturing a bottom gate thin film transistor ("TFT") in which a polycrystalline channel region having a large grain size can be formed relatively simply and easily.

According to an exemplary embodiment of the present invention, a method of manufacturing a bottom gate thin film transistor ("TFT") includes; forming a bottom gate electrode on a substrate; forming a gate insulating layer on the substrate to cover the bottom gate electrode; sequentially forming an amorphous semiconductor layer, an N-type semiconductor layer and an electrode layer on the gate insulating layer; etching an electrode region and an N-type semiconductor layer region formed on the bottom gate electrode sequentially to expose an amorphous semiconductor layer region; melting the amorphous semiconductor layer region; and crystallizing the melted amorphous semiconductor layer region to form a laterally grown polycrystalline channel region.

The amorphous semiconductor layer may be formed of Si or SiGe. The amorphous semiconductor layer may be formed having a thickness in a range of about 500 Å to about 1000 Å. The amorphous semiconductor layer region may be formed having a length in a range of about 2 μm to about 5 μm. The amorphous semiconductor layer region may be melted using a laser annealing method. A laser energy used in the laser annealing method may be controlled in a range of about 700 mJ/cm$^2$ to about 1000 mJ/cm$^2$. The gate insulating layer may be formed of SiO$_2$ or SiN. The bottom gate electrode may be formed of any one selected from the group consisting of Al, Cr, Cu and Mo. The N-type semiconductor layer may be formed of amorphous silicon doped with N-type impurities or polycrystalline silicon doped with N-type impurities. The substrate may be a transparent substrate formed of glass or plastic.

According to another exemplary embodiment of the present invention, a bottom gate thin film transistor ("TFT") includes; a bottom gate electrode formed on a substrate; a gate insulating layer forming on the substrate covering the bottom gate electrode; an amorphous semiconductor layer, an N-type semiconductor layer and an electrode layer sequentially formed on the gate insulating layer; an electrode region and an N-type semiconductor layer region sequentially etched on the bottom gate electrode to expose an amorphous semiconductor layer region; and a laterally grown polycrystalline channel region formed by melting and subsequent crystallization of the amorphous semiconductor layer region.

According to exemplary embodiments of the present invention, a bottom gate TFT having improved field effect mobility can be manufactured simply and easily.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1A:
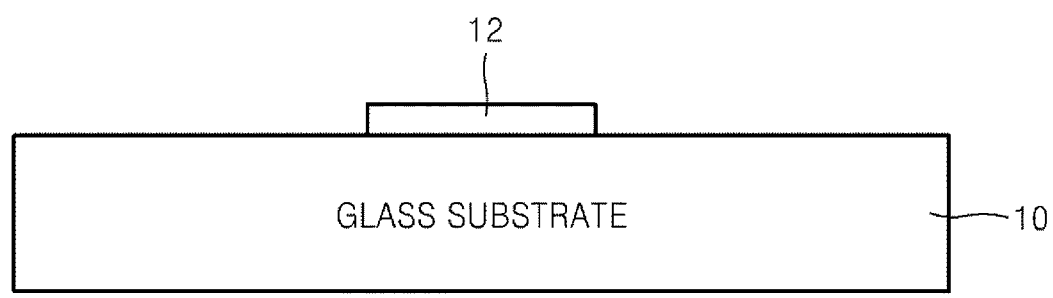
FIGS. 1A through 1F are cross-sectional views illustrating a method of manufacturing a bottom gate thin film transistor ("TFT") according to an exemplary embodiment of the present invention.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, steps, elements, and/or components, but do not preclude the presence or addition of one or more other features, regions, steps, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

FIGS. 1A through 1F are cross-sectional views illustrating a method of manufacturing a bottom gate thin film transistor ("TFT") according to an exemplary embodiment of the present invention. Throughout this specification, material layers may be deposited using various methods such as a chemical vapor deposition ("CVD") method or a physical vapor deposition ("PVD") method, which are known to those of ordinary skill in the art, and thus descriptions thereof will be omitted.

Figure 1B:
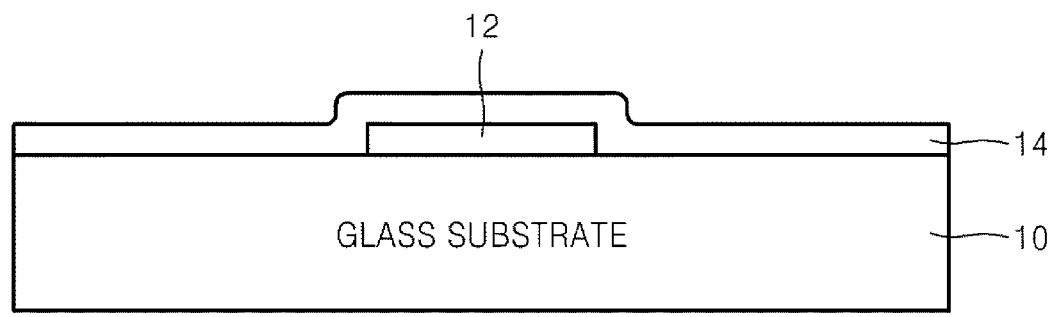
Figure 1C:
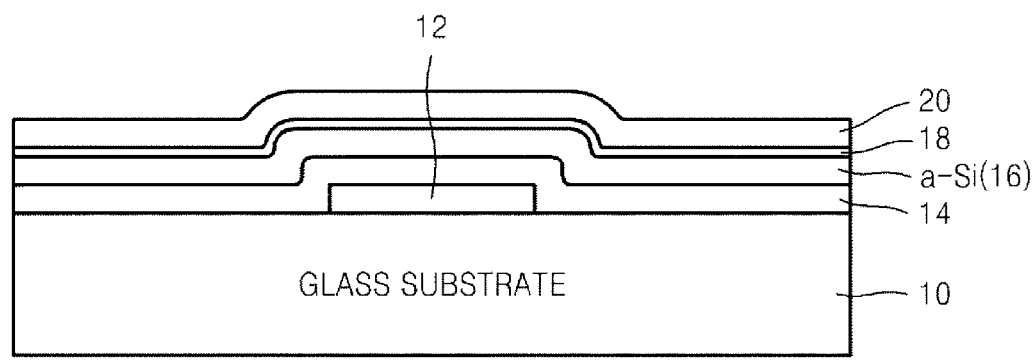

Referring to FIGS. 1A through 1C, a gate metal, such as Al, Cr, Cu, Mo, or the like, is deposited on a substrate 10 and patterned to form a bottom gate electrode 12. Here, the substrate 10 may be a transparent substrate formed of glass or plastic, but materials of the substrate 10 are not limited thereto.

Next, a gate insulating layer 14 is formed on the substrate 10 so as to cover the bottom gate electrode 12. The gate insulating layer 14 may be formed of an insulation material such as $SiO_2$ or SiN. An amorphous semiconductor layer 16, an N-type semiconductor layer 18 and an electrode layer 20 are sequentially formed on the gate insulating layer 14. The amorphous semiconductor layer 16 is formed of Si or SiGe to have a thickness in a range of about 500 Å to about 1000 Å. The range of the thickness of the amorphous semiconductor layer 16 is suitable for melting and crystallization of the amorphous semiconductor layer 16 in the following laser annealing operation, and may be the most suitable range for forming a channel region.

The N-type semiconductor layer 18 is formed of amorphous silicon doped with N-type impurities or polycrystalline silicon doped with N-type impurities. The N-type impurities include atoms such as antimony (Sb), phosphorus (P), arsenic (As), or the like. The electrode layer 20 may be formed of a metal such as Al, Cr, Cu, Mo, or the like.

Figure 1D:
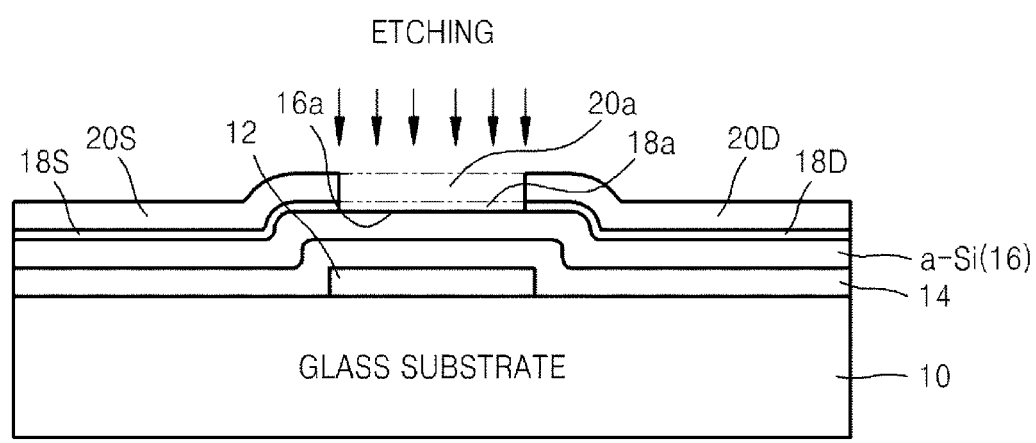

Referring to FIG. 1D, an electrode layer region 20a and an N-type semiconductor layer region 18a (both shown with phantom lines) formed on the bottom gate electrode 12 are etched sequentially to expose an amorphous semiconductor layer region 16a. Meanwhile, in the etching process, source and drain regions are formed to be separated from each other. These will be described later.

The amorphous semiconductor layer region 16a may be formed to have a length in a range of about 2 μm to about 5 μm. The range of the length of the amorphous semiconductor layer region 16a is suitable for the formation of a number of grain boundaries as small as possible within a grain when crystallizing the amorphous semiconductor layer region 16a. Since grain boundaries have an adverse influence on electron mobility within a channel, it is desirable that the number of grain boundaries in the channel region is minimized.

Figure 1E:
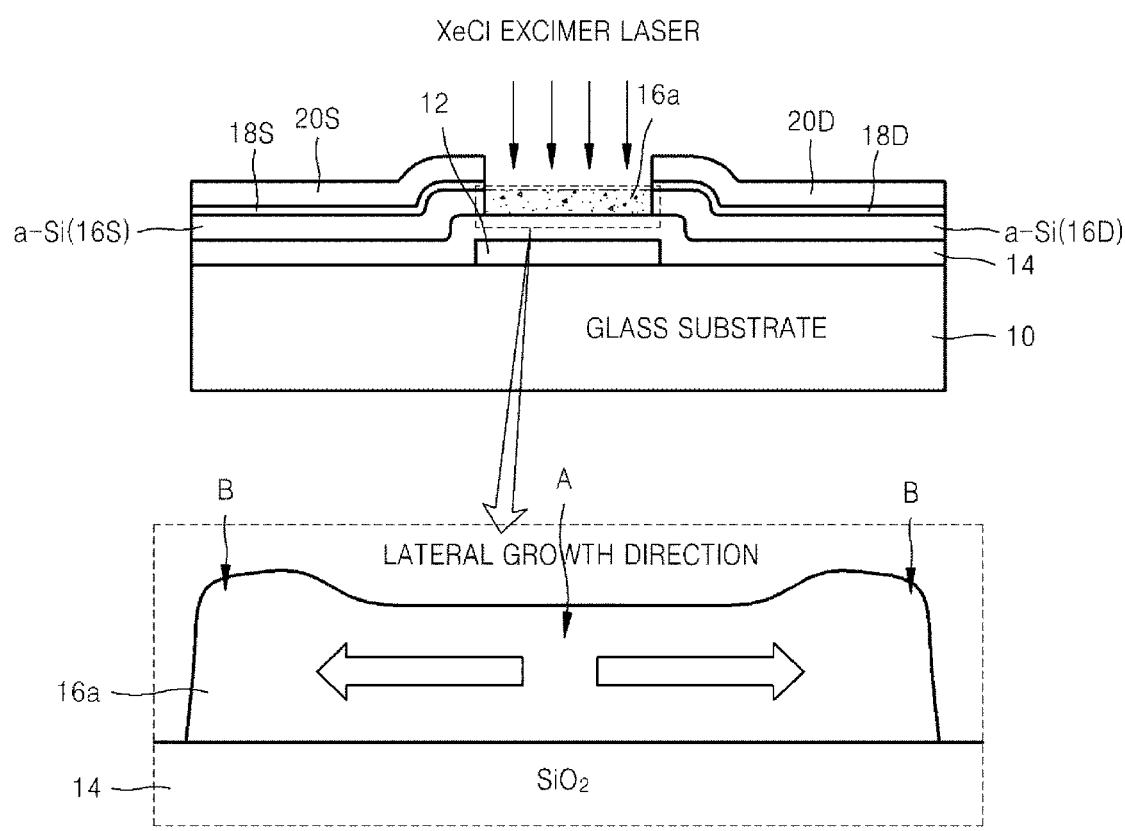
Figure 1F:
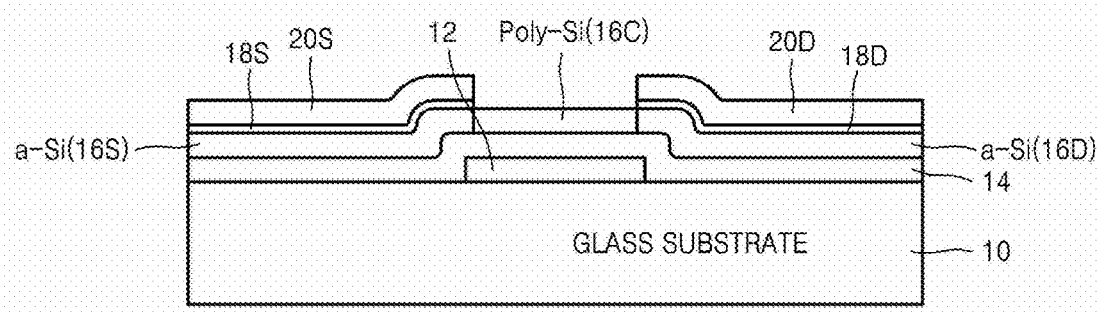
Figure 2:
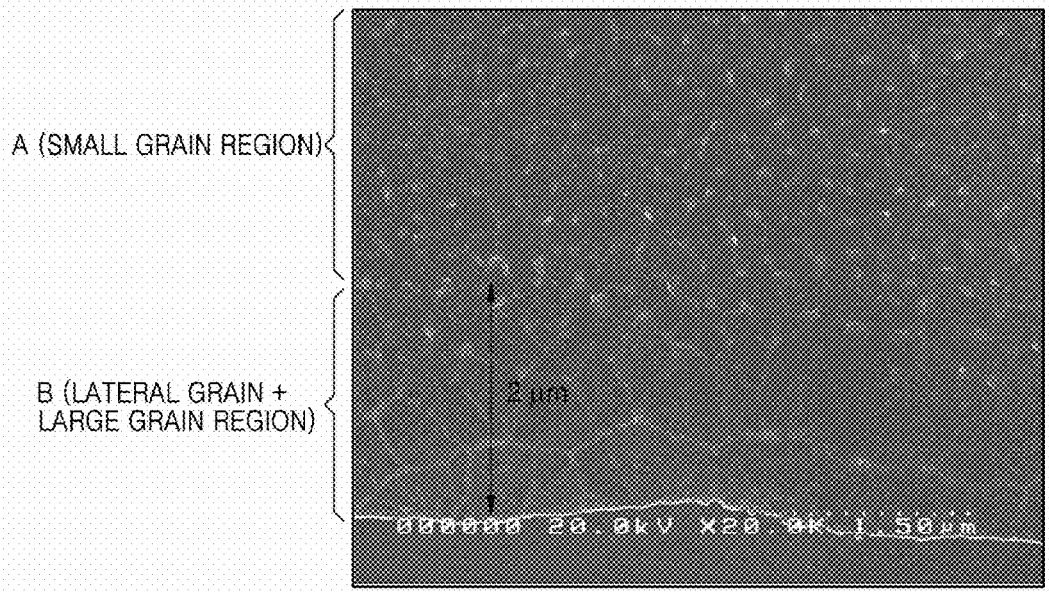
FIG. 2 is a scanning electron microscope ("SEM") photograph of a polycrystalline silicon channel region obtained by laser annealing as illustrated in FIG. 1D, according to an exemplary embodiment of the present invention.

Referring to FIGS. 1E and 1F, the amorphous semiconductor layer region 16a is melted using a laser annealing method to induce crystallization. An XeCl excimer laser having a wavelength of 308 nm is irradiated to heat and melt the amorphous semiconductor layer region 16a. As illustrated in the enlarged portion of the amorphous semiconductor layer region 16a in FIG. 1E, in a melting state, a thickness of a middle part A of the amorphous semiconductor layer region 16a is different from a thickness of both ends B of the amorphous semiconductor layer region 16a. In particular, in the melting state, both ends B are formed to have a thickness greater than the thickness of the middle part A, and the difference between the thickness of the middle part A and the thickness of both ends B has an influence on cooling speed. That is, cooling and solidification can be performed at the middle part A faster than at both ends B. Accordingly, first a crystalline germ grows from the middle part A to both ends B as time elapses. As result of this crystal growth, a laterally grown polycrystalline channel region 16C (FIG. 1F) can be easily formed. The position and size of the laterally grown polycrystalline channel region 16C can be easily determined and controlled. FIG. 1D will become more apparent with reference to FIG. 2, which is a scanning electron microscope ("SEM") photograph of the laterally grown polycrystalline channel region 16C, according to an exemplary embodiment of the present invention.

The laterally grown polycrystalline channel region 16C is formed to have a large grain size, and thus has high mobility and a low defect density. Accordingly, a TFT device can be manufactured having a small leakage current and an excellent switching property. To improve annealing efficiency, the energy density of the laser may be controlled to be in a range of about 700 mJ/cm$^2$ to about 1000 mJ/cm$^2$.

In the bottom gate TFT according to the current exemplary embodiment of the present invention, the source region includes a source electrode 20S, and sources 16S and 18S, which are interposed between the source electrode 20S and the polycrystalline channel region 16C to provide an ohmic contact. The drain region includes a drain electrode 20D, and drains 16D and 18D which are interposed between the drain electrode 20D and the polycrystalline channel region 16C to provide an ohmic contact. Using these operations, a bottom gate TFT device having improved field effect mobility can be manufactured.

According to the present invention, a polycrystalline channel region having a large grain size can be formed relatively simply and easily without requiring additional operations. In addition, a position of the polycrystalline channel region can be easily determined and controlled. In particular, the laterally grown polycrystalline channel region can be easily formed. Since the laterally grown polycrystalline channel region may have high mobility and a low defect density, a bottom gate TFT having improved field effect mobility can be manufactured using the method according to exemplary embodiments of the present invention.

The method of manufacturing a bottom gate TFT according to exemplary embodiments of the present invention can be used in the manufacture of an active matrix LCD ("AMLCD"), an active matrix OLED ("AMOLED"), a solar battery, a semiconductor memory device, or the like, and preferably in the manufacture of a TFT including a glass or plastic substrate and having high mobility and responsiveness. Every electric device including a TFT, an AMLCD, an AMOLED constituting a switching element, an amplifying element, or the like can be manufactured using the method according to exemplary embodiments of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bottom gate thin film transistor (TFT) comprising:
    a bottom gate electrode formed on a substrate;
    a gate insulating layer forming on the substrate covering the bottom gate electrode;
    an amorphous semiconductor layer, an N-type semiconductor layer and an electrode layer sequentially disposed on the gate insulating layer, wherein a portion of the electrode region and a portion of the N-type semiconductor layer region are sequentially etched on a region corresponding to the bottom gate electrode to expose an underlying region of the amorphous semiconductor layer region; and
    a laterally grown polycrystalline channel region disposed on a same layer as the amorphous semiconductor layer region and only disposed in, and entirely filling, a region where the electrode region and the N-type semiconductor layer are etched.

2. The bottom gate TFT of claim 1, wherein the amorphous semiconductor layer is formed of Si or SiGe.

3. The bottom gate TFT of claim 1, wherein the amorphous semiconductor layer has a thickness in a range of about 500 Å to about 1000 Å.

4. The bottom gate TFT of claim 1, wherein the amorphous semiconductor layer region has a length in a range of about 2 μm to about through 5 μm.

5. The bottom gate TFT of claim 1, wherein the N-type semiconductor layer includes amorphous silicon doped with N-type impurities or polycrystalline silicon doped with N-type impurities.

6. The bottom gate TFT of claim 1, wherein the amorphous semiconductor layer region is melted using a laser annealing method.

7. The bottom gate TFT of claim 6, wherein a laser energy used in the laser annealing method is controlled in a range of about 700 mJ/cm$^2$ to about 1000 mJ/cm$^2$.

8. The bottom gate TFT of claim 1, wherein the gate insulating layer includes $SiO_2$ or SiN.

9. The bottom gate TFT of claim 1, wherein the bottom gate electrode includes any one selected from the group consisting of Al, Cr, Cu and Mo.

10. The bottom gate TFT of claim 1, wherein the electrode layer includes any one selected from the group consisting of Al, Cr, Cu and Mo.

11. The bottom gate TFT of claim 1, wherein the substrate is a transparent substrate including glass or plastic.

* * * * *